United States Patent
Bellorado et al.

(10) Patent No.: US 10,276,197 B2
(45) Date of Patent: Apr. 30, 2019

(54) PARALLELIZED WRITING OF SERVO RRO/ZAP FIELDS

(71) Applicant: Seagate Technology LLC, Cupertino, CA (US)

(72) Inventors: Jason Bellorado, San Jose, CA (US); Marcus Marrow, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/793,864

(22) Filed: Oct. 25, 2017

(65) Prior Publication Data

US 2018/0366149 A1 Dec. 20, 2018

Related U.S. Application Data

(60) Provisional application No. 62/522,248, filed on Jun. 20, 2017.

(51) Int. Cl.
*G11B 5/09* (2006.01)
*G11B 5/596* (2006.01)

(52) U.S. Cl.
CPC ...... *G11B 5/59666* (2013.01); *G11B 5/59633* (2013.01)

(58) Field of Classification Search
CPC .. G11B 5/012; G11B 5/02; G11B 5/55; G11B 5/596–5/59633; G11B 5/5965–5/59666; G11B 5/59694
USPC .............. 360/55, 69, 75, 77.04–77.08, 78.04
See application file for complete search history.

(56) References Cited

U.S. PATENT DOCUMENTS

| | | | |
|---|---|---|---|
| 5,321,564 A | 6/1994 | Takahashi | |
| 5,742,532 A | 4/1998 | Duyne et al. | |
| 5,970,093 A | 10/1999 | Lantremange | |
| 6,157,510 A | 12/2000 | Schreck et al. | |
| 6,320,920 B1 | 11/2001 | Beyke | |
| 6,377,552 B1 | 4/2002 | Moran et al. | |
| 6,670,901 B2 | 12/2003 | Brueske et al. | |
| 6,687,073 B1 * | 2/2004 | Kupferman | G11B 5/59655 360/75 |
| 6,697,891 B2 * | 2/2004 | Emberty | G11B 20/1217 360/137 |
| 6,738,215 B2 * | 5/2004 | Yatsu | G11B 5/59655 360/75 |
| 6,950,258 B2 * | 9/2005 | Takaishi | G11B 5/59633 360/75 |

(Continued)

OTHER PUBLICATIONS

Bellorado et al., "Target Parameter Adaptation", U.S. Appl. No. 15/334,167, filed Oct. 25, 2016, Seagate Technology LLC.

*Primary Examiner* — Peter Vincent Agustin
(74) *Attorney, Agent, or Firm* — Cesari & Reed, LLP; Kirk A. Cesari

(57) ABSTRACT

An apparatus may include a first and second servo channels configured to output first and second position information to first and second writers, respectively, via a shared write path such that the first and second writers write first and second position information to first and second magnetic recording medium surfaces, respectively. In addition, the apparatus may include a controller configured to control the shared write path such that write access is changed between the first servo channel and second servo channel a plurality of times during a revolution of the first magnetic recording medium surface and second magnetic recording medium surface.

20 Claims, 5 Drawing Sheets

(56) References Cited

U.S. PATENT DOCUMENTS

| | | |
|---|---|---|
| 6,993,291 B2 | 1/2006 | Parssinen et al. |
| 7,046,701 B2 | 5/2006 | Mohseni et al. |
| 7,133,233 B1 * | 11/2006 | Ray .................. G11B 5/59683 360/75 |
| 7,245,448 B2 * | 7/2007 | Urata ................ G11B 5/59694 360/51 |
| 7,298,573 B2 | 11/2007 | Kitamura |
| 7,324,437 B1 | 1/2008 | Czylwik et al. |
| 7,362,432 B2 | 4/2008 | Roth |
| 7,940,667 B1 | 5/2011 | Coady |
| 8,139,301 B1 | 3/2012 | Li et al. |
| 8,172,755 B2 | 5/2012 | Song et al. |
| 8,400,726 B1 | 3/2013 | Wu et al. |
| 8,456,977 B2 | 6/2013 | Honma |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,713,413 B1 | 4/2014 | Bellorado et al. |
| 8,755,139 B1 | 6/2014 | Zou et al. |
| 8,760,794 B1 | 6/2014 | Coker et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 | 2/2015 | Pokharel |
| 9,007,707 B1 | 4/2015 | Lu et al. |
| 9,019,642 B1 | 4/2015 | Xia et al. |
| 9,064,537 B1 | 6/2015 | Nie |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 | 9/2015 | Grundvig et al. |
| 9,196,298 B1 | 11/2015 | Zhang et al. |
| 9,245,579 B2 | 1/2016 | Song et al. |
| 9,245,580 B1 | 1/2016 | Lu et al. |
| 9,257,135 B2 | 2/2016 | Ong et al. |
| 9,286,915 B1 | 3/2016 | Dziak et al. |
| 9,311,937 B2 | 4/2016 | Zou et al. |
| 9,401,161 B1 | 7/2016 | Jury |
| 9,424,878 B1 | 8/2016 | Dziak et al. |
| 9,431,052 B2 | 8/2016 | Oberg et al. |
| 9,508,369 B2 * | 11/2016 | Chu ....................... G11B 5/012 |
| 9,542,972 B1 | 1/2017 | Nayak et al. |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 2002/0181439 A1 | 12/2002 | Orihashi et al. |
| 2003/0198165 A1 | 10/2003 | Mouri et al. |
| 2010/0290153 A1 * | 11/2010 | Hampshire ........ G11B 5/59605 360/77.08 |
| 2011/0090773 A1 | 4/2011 | Yu et al. |
| 2011/0176400 A1 * | 7/2011 | Gerasimov ........ G11B 5/59666 369/47.15 |
| 2012/0105994 A1 | 5/2012 | Bellorado et al. |
| 2012/0155577 A1 | 6/2012 | Shukla et al. |
| 2017/0249206 A1 | 8/2017 | Jeong et al. |

* cited by examiner

PARALLELIZED WRITING OF SERVO RRO/ZAP FIELDS

SUMMARY

In certain embodiments, an apparatus may include a first servo channel configured to output first position information to a first writer via a shared write path such that the first writer writes the first position information to a first magnetic recording medium surface and a second servo channel configured to output second position information to a second writer via the shared write path such that the second writer writes the second position information to a second magnetic recording medium surface. In addition, the apparatus may include a controller configured to control the shared write path such that write access is changed between the first servo channel and second servo channel a plurality of times during a revolution of the first magnetic recording medium surface and second magnetic recording medium surface.

In certain embodiments, a system may include a first servo channel configured to output first position information to a first writer such that the first writer writes the first position information to a first magnetic recording medium surface of a hard disk drive and a second servo channel configured to output second position information to a second writer such that the second writer writes the second position information to a second magnetic recording medium surface of the hard disk drive. The first servo channel may be configured to output first position information to the first writer such that the first position information is written to a first location and a second location, separate from the first location, during a particular revolution and the second servo channel may be configured to output second position information to the second writer such that the second position information is written to a third location during the particular revolution. In some embodiments, the third location is between the first location and second location.

In certain embodiments, a method may include, during a revolution of a hard disk assembly of a multi-sensor magnetic recording (MSMR) hard drive, reading, by a first reader of the MSMR hard drive, from a first magnetic recording medium surface to generate a first read signal, determining, by a first servo channel of the MSMR hard drive, a first write position at which to write first position information based at least in part on the first read signal, requesting, from a controller of the MSMR hard drive, by the first servo channel, write access to a shared write path based on the determined first write position, receiving, by the first servo channel, a first assignment of write access, outputting, by the first servo channel, the first position information to a first writer via the shared write path, and returning, by the first servo channel, write access to the controller when the output of the first position information is complete. During the same revolution, the method may further include reading, by a second reader of the MSMR hard drive, from a second magnetic recording medium surface to generate a second read signal, determining, by a second servo channel of the MSMR hard drive, a second write position at which to write second position information based at least in part on the second read signal, requesting, from the controller of the MSMR hard drive, by the second servo channel, write access to the shared write path based on the determined second write position, receiving, by the second servo channel, a second assignment of write access, outputting, by the second servo channel, the second position information to a second writer via the shared write path, and returning, by the second servo channel, write access to the controller when the output of the second position information is complete.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to multi-sensor magnetic recording (MSMR) systems, and in some embodiments, the present disclosure may relate to MSMR hard drives that may include functionality to write position information such as servo fields, RRO/ZAP fields or other formatting information to a plurality of storage surfaces in parallel. MSMR systems according to this disclosure may further perform the writing of the position information to the plurality of storage surfaces in parallel using the plurality of read paths and single write path of an MSMR architecture. In some embodiments, the MSMR systems may be configured to coordinate write access between the servo channels that may control the writers that may write to corresponding surfaces of the plurality of storage surfaces. Some MSMR systems according to this disclosure may also allow for the parallelized writing to the multiple surfaces to be performed using separate clock domains.

An example of such a system is discussed below with regard to FIG. 1.

Figure 1:
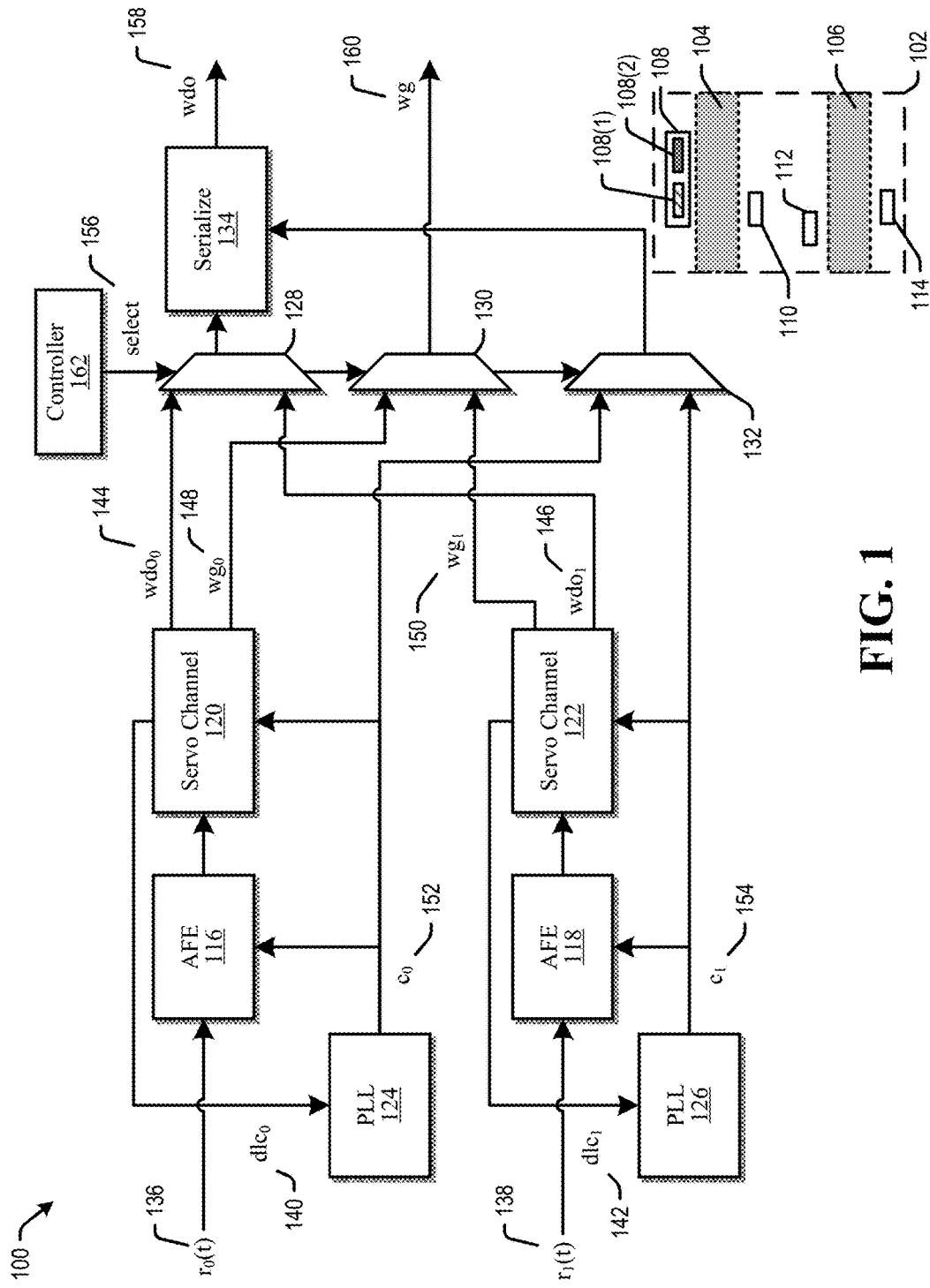
FIG. 1 is a block diagram of a multi-sensor magnetic recording (MSMR) system architecture which may include functionality to write position information such as servo fields, RRO/ZAP fields or other formatting information to a plurality of storage surfaces in parallel, in accordance with certain embodiments of the present disclosure.

Referring to FIG. 1, a block diagram of a multi-sensor magnetic recording (MSMR) system architecture which may include functionality to write position information such as servo fields, RRO/ZAP fields or other formatting information to a plurality of storage surfaces in parallel is shown and is generally designated 100. More particularly, FIG. 1 may illustrate an example embodiment of a MSMR hard drive that may include functionality to write position information such as servo fields, RRO/ZAP fields or other formatting information to a plurality of storage surfaces in parallel.

System 100 may include a head-disk assembly (HDA) 102 that may include two magnetic storage mediums 104 and 106. The HDA 102 may further include read/write heads 108 and 110 which may read and write to the top and bottom magnetic storage surfaces of the magnetic storage medium 104, respectively, and read/write heads 112 and 114 which may read and write to the top and bottom magnetic storage surfaces of the magnetic storage medium 106, respectively. As shown with regard to the read/write heads 108, each surface may have a read head (e.g. read head 108(1)) and a write head (e.g. write head 108(2)). The read head and write head of a surface may be separated by a non-negligible distance (e.g., 100 tracks). Though not shown, each of read/write heads 110-114 may also include a read head and a write head. Each of the read/write heads may include multiple read-sensors (or readers) fabricated on a single read-head such that multiple copies of a read-back signal may be obtained simultaneously from the respective magnetic storage surface (e.g. from a particular track) and a writer fabricated on a write-head to be utilized for data storage to the respective magnetic storage surface. Each of the read/write heads 108-114 may be mounted on a slider, all of which may connect to an actuator arm for positioning over the media. A servo control may be configured to drive a servo mechanism which may move the slider to position the read/write heads in a desired location relative to the magnetic storage surfaces of the magnetic storage mediums 104 and 106.

In addition, the system 100 may include micro head actuators that may allow for read/write head locations to deviate, by a small amount, from their location at the end of the slider arm. In some embodiments, the micro head actuators may be independently controlled from one another. This may allow for multiple heads to be positioned over respective track centers even when the track centers are not exactly aligned to the slider location. For example, micro head actuators may allow for the readers, writer, or both of 108 to be centered over a track on the top magnetic storage surface of the magnetic storage medium 104 while the readers, writer, or both of 114 are centered over a track on the bottom magnetic storage surface of the magnetic storage medium 106, even though the tracks are not exactly aligned with one another. In another example, micro head actuators may allow for the readers, writer, or both of 108 to be centered over a track on the top magnetic storage surface of the magnetic storage medium 104 while the readers, writer, or both of 110 are centered over a track on the bottom magnetic storage surface of the magnetic storage medium 104, even though the tracks are not exactly aligned with one another.

Figure 2:
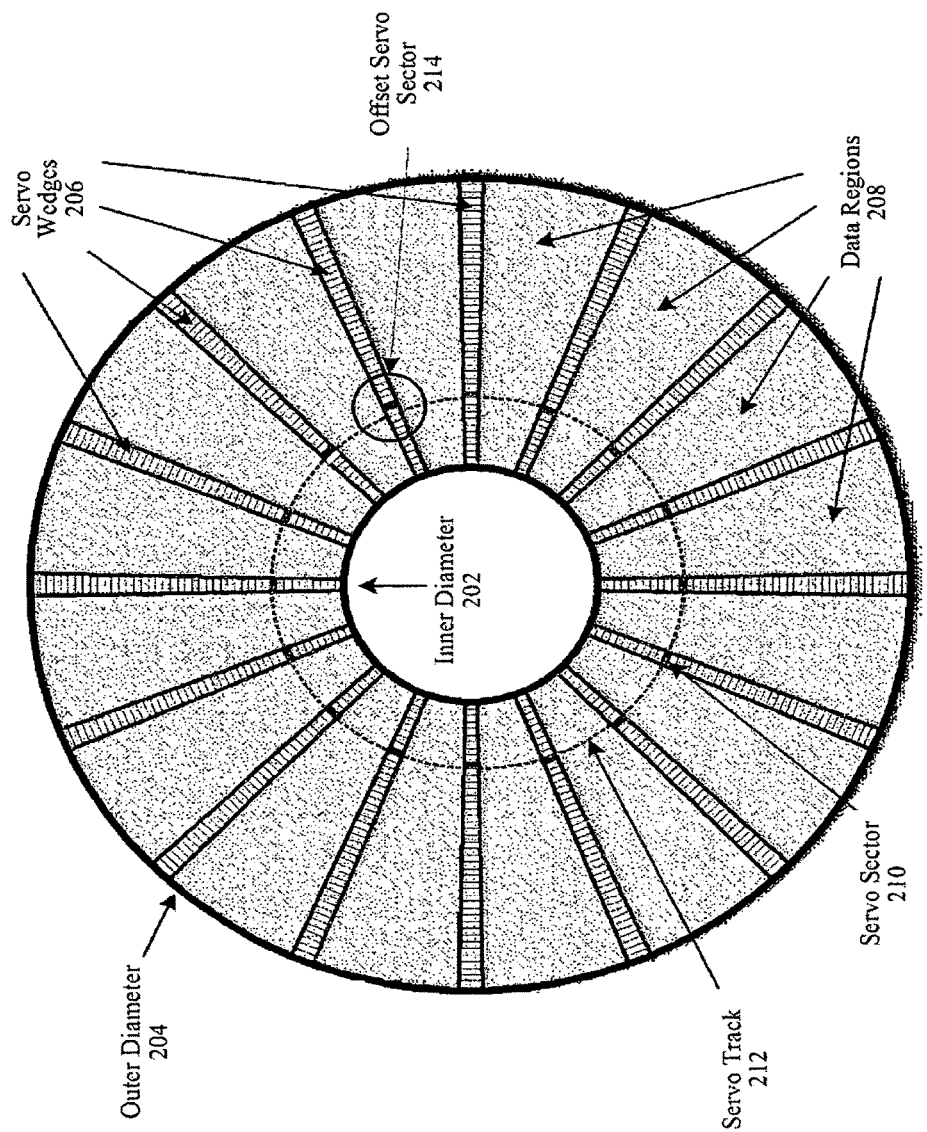
FIG. 2 illustrates a block diagram of a surface of an example magnetic storage mediums of the multi-sensor magnetic recording (MSMR) system architecture, in accordance with certain embodiments of the present disclosure.

Referring to FIG. 2, a diagram of a surface of an example magnetic storage medium (e.g. 104 and 106) of the multi-sensor magnetic recording (MSMR) system architecture 100 is shown and is generally designated 200. More particularly, surface 200 may generally show the layout of position information such as servo or RRO/ZAP fields on a surface of a magnetic storage medium of a hard disk drive.

The position information may allow the hard drive to determine the position of a read/write heads relative to the surface of the magnetic storage medium. The examples herein include parallelized writing RRO/ZAP fields based on servo information. This is merely done as an example and embodiments are not so limited and other position information schemes may be utilized.

Reliable storage of data, and its subsequent retrieval, from a hard disk drive (HDD) may require that the read/write heads be placed over the spinning media with a very high degree of accuracy. To achieve this, a servo pattern (or other position information) may be written to the media during manufacturing which may contain information regarding radial and tangential positioning on the disk. As shown in FIG. 2, the servo pattern may span from the inner diameter 202 of the disk to the outer diameter of the disk 204 and may be placed at regular intervals around the disk. As shown, the servo wedges 206 may be separated by data regions 208 that may store non-servo data (e.g. user data). The servo pattern may be demodulated each time a read-head passes over a servo sector 210 in the servo wedges 208. The demodulated information may then be used to determine a location of the read-head from which the write/head position may be inferred. Based on the determined location of the read/write head, deviations from the desired position may be determined and rectified to maintain the integrity of the operation (e.g. read/write/seek/etc.).

As mentioned above, writing the servo pattern to the disk may be accomplished at the time of manufacturing using either a dedicated machine (known as a servo disk writer (SDW) or a multi-disk writer (MDW)) or through a process known as self-servo write (SSW), in which the embedded controller may be used to write servo pattern. Although the servo pattern may be directly used for the servo operation, its use may be complicated by written-in eccentricities in the servo pattern, a phenomenon depicted in FIG. 2. As shown, a servo track 212 may be defined as a set of servo sectors 210 written at an (approximately) equal radius from the disk center (e.g. servo sectors sharing a track id, which may be written into the servo sectors). Due to imperfections in the servo writing procedure, not all servo sectors may fall on the idealized, circular, track shown as the dashed line of the servo track 212 in FIG. 2 (offset servo sector 214). As such, an attempt to follow the written servo track 212 may entail moving the read-head continually inwards and outwards to match the trajectory of the irregularly shaped track 212. This phenomenon, known as repeatable runout (RRO), may cause performance degradation and may limit the achievable linear track density of an HDD.

In some examples, RRO, which may generally be characterized as a non-zero mean of the generated radial position error associated with a given servo sector 210, may be compensated. For this, after the servo pattern is written, the system may learn the eccentricity by following a given servo track 212 and monitoring a repeatable portion. The learned values may be used to generate compensation factors that may then be written as fields following each servo sector 210 such that the compensation factors may be retrieved and used during normal operation of the servo system. These fields may be referred to as either RRO fields or Zero Acceleration Profile (ZAP) fields.

The process of writing ZAP fields may be time consuming. Although the time to compute the compensation values may be reduced by only considering a subset of tracks and using interpolation to determine the values in-between, the writing process may be conducted for every servo sector 210 on the magnetic storage surface 200. As an elongated manufacturing time may directly correspond to an increase in cost, reducing manufacturing time may be desirable. Some embodiments herein may allow for the parallelization of ZAP field writes. However, as mentioned above, embodiments are not limited to writing ZAP fields or servo information. Rather, embodiments may be applied to parallelized writing of any information to multiple disk surfaces. Further, in some embodiments, the architecture disclosed herein may require minimal changes from a MSMR architecture.

As mentioned above, the systems and techniques disclosed herein may allow for the parallelized writing of ZAP fields to a plurality of storage surfaces, which may save significant manufacturing time that is otherwise consumed with this activity.

Returning to FIG. 1, the disclosed HDA 102 and multi-sensor magnetic recording (MSMR) system architecture 100 may include coupling of the readers of the read/write heads 108-114 to the input paths that include the analog front-ends (AFEs) 116 and 118 (e.g. illustrated as the inputs to 116 and 118) which in turn may be coupled to respective servo channels 120 and 122. The system may further include phase locked loops (PLLs) 124 and 126. The servo channels 120 and 122 and PLLs 124 and 126 may be coupled to MUXs 128-132. In turn, the MUXs 124 and 128 may be coupled to the serialize circuit 134. The outputs of the MUX 130 and the serialize circuit 134 may be coupled to an output or write path that may include the writers of the read/write heads 108-114. In addition, the system may further include a controller 162 coupled to the MUXs 128-130.

Each of the HDA 102, the AFEs 116 and 118, the servo channels 120 and 122, PLLs 124 and 126, the MUXs 128-132, the serialize circuit 134 and controller 162 may be a separate circuit, a system on chip (SOC), firmware, a processor(s), or other system not listed, or any combination thereof.

As mentioned above, the read/write heads 108 and 110 (e.g. the readers or read-sensors thereof) may read from respective magnetic storage surfaces of the magnetic storage mediums 104 and 106. The readers of the read/write heads 108 and 110 may each produce a continuous time input signal from magnetic interactions with the respective surfaces. The readers may be selectively coupled to the AFEs 116 and 118 such that continuous time input signals from selected readers may be provided to the AFEs 116 and 118 as continuous time input signals $r_0(t)$ 136 and $r_1(t)$ 138. The AFEs 116 and 118 may process $r_0(t)$ 136 and $r_1(t)$ 138 to produce filtered and gain-adjusted continuous time input signals which may in turn be provided to the servo channels 120 and 122 respectively. For example, in operation, the AFEs may each receive a continuous-time signal and perform processing such as analog filtering and applying a gain.

The PLLs 124 and 126 may each operate to produce a clock signal $c_0$ 152 and $c_1$ 154 which may then be provided to the MUX 132 and a respective pair of the AFE 116 and servo channel 120 or AFE 118 and servo channel 122.

The servo channels 120 and 122 may produce respective disk locked clock signals $dlc_0$ 140 and $dlc_1$ 142 and provide $dlc_0$ 140 and $dlc_1$ 142 to PLLs 124 and 126, respectively, as feedback. The disk locked clock signals may allow for the frequency and phase of the sampling clocks produced by the PLLs for the AFEs to be locked to the servo pattern written to the respective magnetic storage surface (or to be written to the respective magnetic storage surface). By providing respective PLLs for each AFE and servo channel (e.g. for each surface being written), the clock domains and one or both of the frequency and the phase used for each surface may be independent. For example, the PLLs may receive the disk locked clock signals $dlc_0$ 140 and $dlc_1$ 142 and adjust the frequency and phase used to generate the clock signals $c_0$ 152 and $c_1$ 154.

In addition, the servo channels 120 and 122 may process the continuous time signals processed by the AFE 116 and 118, respectively. Depending on what data is to be written to the magnetic storage surfaces, the processing may differ. In an example in which RRO/ZAP fields are to be written, the servo channels 120 and 122 may detect already written servo information and output a RRO/ZAP field data as $wdo_0$ 144 and $wdo_1$ 146 and a write gate signal as $wg_0$ 148 and $wg_1$ 150, respectively, to cause a respective writer to write the RRO/ZAP field data to the respective magnetic storage surface. In other examples in which servo fields are to be written, similar operations may be performed by the servo channels 120 and 122 with regard to pre-servo field markings (e.g. spiral patterns).

As mentioned before, the architecture illustrated in FIG. 1 may be an example embodiment which has few changes from an MSMR architecture. For example, an MSMR architecture includes multiple read paths for the multiple readers on each read head (e.g. reading a same track) but includes one write path for the single writer on each MSMR write head. Similarly, in the architecture of FIG. 1, the write path has not been duplicated. It should be noted that embodiments according to this disclosure are not so limited and may include architectures performing similar functions with any number of write paths.

In the case of architectures similar to FIG. 1, the non-duplication of the write path may result in corruption of servo or RRO/ZAP fields when the servo fields are aligned or closely spaced in the direction of rotation of the HDA. For example, when the RRO fields are aligned, both servo channels may attempt to write over the single path simultaneously, resulting in corruption of one or more of the fields. As such, MSMR systems according to this disclosure may be configured to perform write access control and error recovery between the servo channels such that the writers may be prevented from attempting to write simultaneously which may otherwise cause corruption of the servo or position markings.

To provide such write control, the system 100 may include the MUXs 128-132 that may select between the servo channels based on the select signal 156 which may be provided by a firmware or hardware controller 162. In particular, the MUX 128 may receive the write data $wdo_0$ 144 and $wdo_1$ 146 from the servo channels 120 and 122 and select between $wdo_0$ 144 and $wdo_1$ 146 based on the select signal 156. The MUX 130 may receive the write gate signals $wg_0$ 148 and $wg_1$ 150 from the servo channels 120 and 122 and select between $wg_0$ 148 and $wg_1$ 150 based on the select signal 156. MUX 130 may output the selected write gate $wg_0$ 148 or $wg_1$ 150 as wg 160. In addition, the MUX 132 may receive the clock signals $c_0$ 152 and $c_1$ 154 from the PLLs 124 and 126 and select between $c_0$ 152 and $c_1$ 154 based on the select signal 156. In some embodiments, the separation between servo wedges on different surfaces in the direction of rotation may be sufficient to allow a firmware controller of a MSMR hard drive to control the selection of the servo channel 120 or 122 which is allowed to write. In such examples, the controller 162 may alternate write access between a plurality of servo channels based on a predetermined pattern or based on a pattern determined by the controller 162 during the determination of the RRO. In other examples, such as that shown in FIG. 3 and described below, feedback may be included between the servo channels and a hardware or firmware controller which may allow for a requesting of write access, assignment of write access, and for the servo channel with write access to inform the hardware or firmware controller of the completion of writing. The feedback system may also allow the controller to deny write access when another servo channel has already been assigned and has not relinquished write access.

The serialize circuit 134 may operate to receive one of the write data $wdo_0$ 144 or $wdo_1$ 146 from the MUX 128 (e.g. based on the select signal 156) and output the continuous-time write waveform wdo 158 to a write path and writer corresponding to the reader whose input signal is being processed by the servo channel with write access. As shown in FIG. 1, the logic of the serialize circuit 134 may change between being clocked by the PLL 124 and PLL 126 based on the select signal 156. In this manner, the output frequency may be matched to the input frequency.

Figure 3:
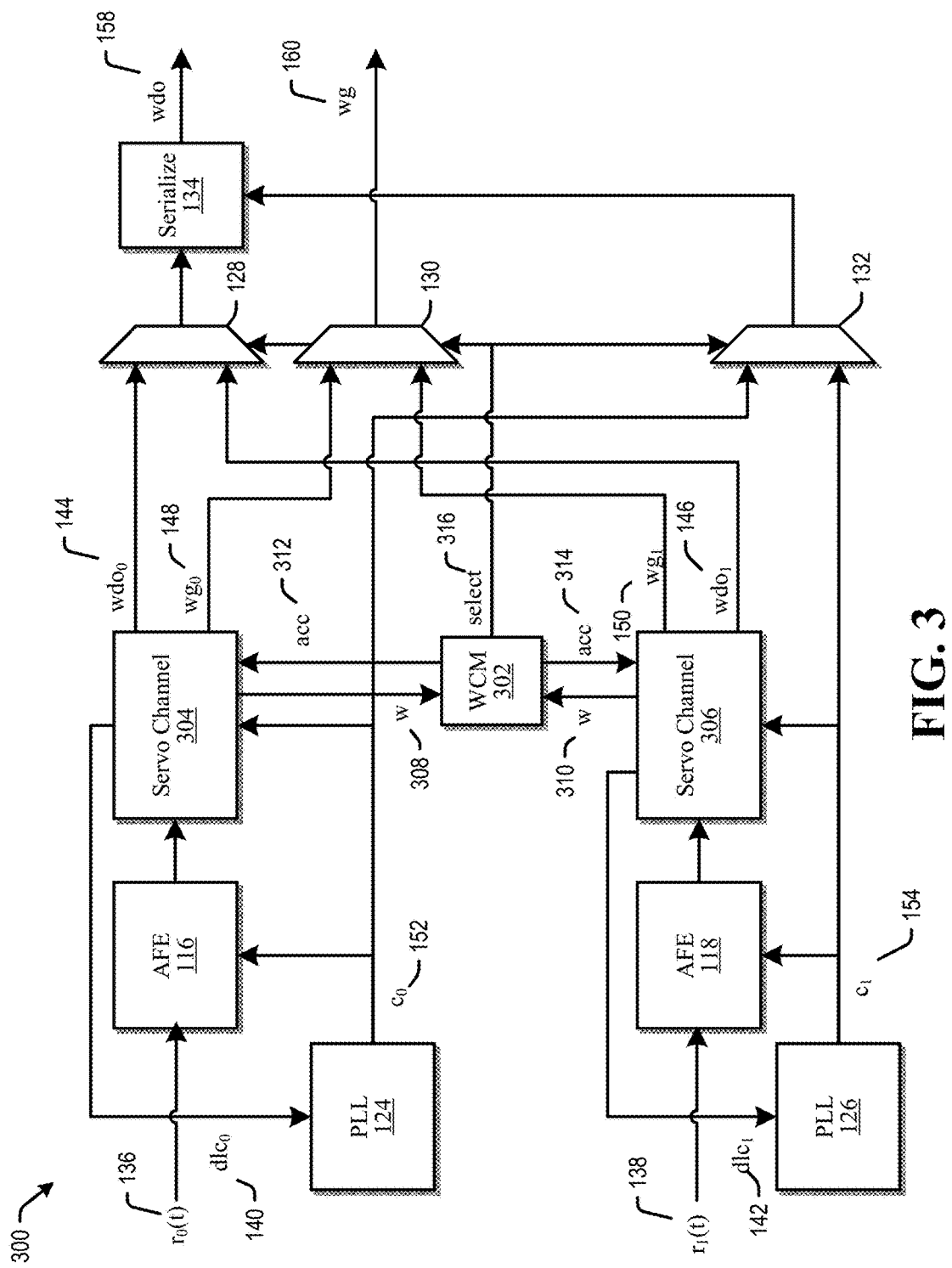
FIG. 3 illustrates a block diagram of a block diagram of a multi-sensor magnetic recording (MSMR) system architecture which may include functionality to write position information such as servo fields, RRO/ZAP fields or other formatting information to a plurality of storage surfaces in parallel, in accordance with certain embodiments of the present disclosure.

FIG. 3 illustrates a block diagram of a multi-sensor magnetic recording (MSMR) system architecture which may include functionality to write position information such as servo fields, RRO/ZAP fields or other formatting information to a plurality of storage surfaces in parallel is shown and is generally designated 300. More particularly, FIG. 3 may illustrate an example embodiment of a MSMR hard drive similar to that shown in FIG. 1 which includes a hardware write control module WCM 302. In some examples, the use of a write control module WCM 302 may allow for the servo wedges or RRO/ZAP fields being written to be closer than may be possible using firmware.

As the operation of items 102-118 and 124-134 in FIG. 3 is similar to that discussed in FIG. 1, these operations will not be fully discussed again with regard to FIG. 3. In summary, the analog front-ends (AFE 116 and AFE 118) may receive respective read-back signals $r_0(t)$ 136 and $r_1(t)$ 138. Each signal 136 and 138 may come from a different surface (which can be different surfaces of the same disk or from different disks). In particular, these read-back signals may come from the surfaces on which a parallelized write of ZAP fields is being performed.

As with FIG. 1, the system 300 may utilize the multiple read paths and single write path of a MSMR architecture. However, instead of reading using the multiple heads disposed above each surface, system 300 may direct the read signal from a single head for each surface being written over a respective one of the multiple read paths. In some examples, the system 300 may use micro head actuator technology to enable each read/write head to follow a respective servo track of a respective surface in an independent manner. This may allow the RRO to be effectively learned and the respective write-heads to be positioned at the respective desired locations.

The multiple read signals may be processed by respective AFEs 116 and 118 and then respective servo channels 304 and 306. Aside from the differences discussed below, the operation of the servo channels 304 and 306 may be similar to those of servo channels 120 and 122 discussed above. As with FIG. 1, the servo channels 304 and 306 may operate on different clock domains. More particularly, the operation of the disk locked clock signals $dlc_0$ 140 and $dlc_1$ 142 may lock each PLL 124 and 126 to the written servo pattern it is demodulating (e.g. of read-back signals $r_0(t)$ 136 and $r_1(t)$ 138, respectively).

As discussed above, the independent operation of the servo channels may allow each to be locked to its respective surface such that either may initiate a ZAP write to the disk. Because the system 300 may include a single wdo port (e.g. write path), the servo channels 304 and 306 may communicate with the WCM circuit 302 to handle the sharing of the wdo line between the servo channels. It should be noted that embodiments are not limited to a single wdo port or write path and other embodiments may include any number of write paths.

In operation, each servo channel 304 and 306 may process the signal from its AFE 116 and 118 to determine the RRO/ZAP field write location. At the appropriate time prior to the determined write location, a servo channel may generate a write-data output pattern $wdo_0$ 144 or $wdo_1$ 146, may request write access from the WCM 302 along line w 308 or 310 and may output a write gate signal $wg_0$ 148 or $wg_1$ 150 to the MUX 130.

The write control module (WCM) 302 may receive the write access request along line w 308 or 310. The WCM 302 may determine whether write access has already been granted to another servo channel. If write access has already been granted to another servo channel, the WCM 302 may deny write access to the requesting servo channel 304 or 306 using the respective access control line (e.g. acc 312 or 314) and may generate an error. On the other hand, if write access has not already been granted, the WCM 302 may provide write access to the requesting servo channel 304 or 306 along the respective access control line (e.g. acc 312 or 314) and update its state to indicate write access is currently being used by the requesting servo channel. The WCM 302 may further generate or update a select signal 316 and output the select signal 316 to the MUXs 128-132 such that the MUXs 128-132 select inputs associated with the requesting servo channel. Upon receiving write access, the servo channel 304 or 306 may output the write data via the serialize circuit 134. Once the servo channel completes the write operation, the servo channel may inform the WCM 302 using w 308 or 310 to relinquish control such that it may be granted to another servo channel.

As mentioned above, if a write access error occurs (e.g. due to a servo channel requesting write access while another servo channel is writing), an error handling process may be initiated. The error handling process may vary between embodiments. In some embodiments, the location of the RRO/ZAP field which was not written due to the denied write request may be stored, a counter may be incremented, and the process may continue for a current revolution. At the end of a current revolution, writes may be performed for the RRO/ZAP fields which were not written due to denied write requests. In addition, the counter may be checked to determine whether a threshold number of errors occurred. If the threshold number of errors occurred, various changes may be made to the write process. For example, the parallel RRO/ZAP writing process may be discontinued for the current surfaces or for one or more surfaces which have conflicting write times (e.g. where two out of three surfaces are conflicting, writing to one of the conflicting surfaces may be discontinued until writing has completed for the remaining two surfaces). In another example, if a surface not involved in the current writing process remains for RRO/ZAP fields writing, one of the conflicting surface may be discontinued while the uninvolved surface is written with the remaining conflicting surface(s). These are merely examples of error handling processes and, in view of this disclosure, one of ordinary skill in the art would envision may additional variations.

Although this disclosure provided examples of parallelizing RRO/ZAP field writes to two storage surfaces, the systems and processes disclosed herein may be generalized to an arbitrary number of parallelized writes. For example, some embodiments may provide parallelization beyond the number of readers by adding additional read-signal input ports and servo channels. One of ordinary skill in the art would envision may additional variations in view of this disclosure.

Figure 4:
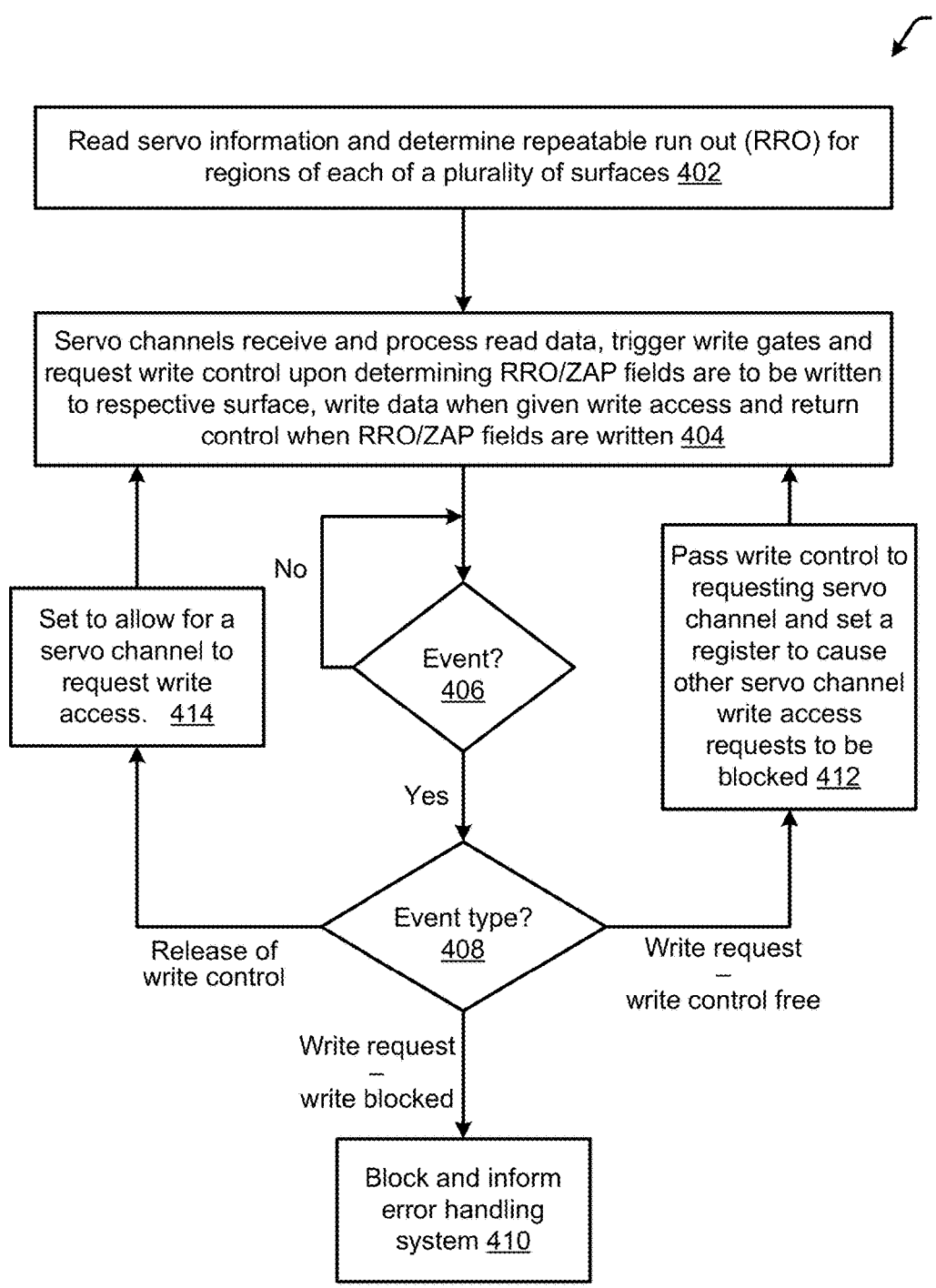
FIG. 4 is a flowchart of a method that may control parallelized writing of RRO/ZAP fields to multiple storage surfaces, in accordance with certain embodiments of the present disclosure.

Referring to FIG. 4, a flowchart of a method that may control parallelized writing of RRO/ZAP fields to multiple storage surfaces is shown and is generally designated 400. More particularly, flowchart 400 may be a flow of operations of the systems 100-300 detailed above with respect to FIGS. 1-3.

In operation, the system may read servo information from a plurality of surfaces and determine the repeatable run out (RRO) for regions of each of a plurality of surfaces at 402. At 404, the system may initialize the parallelized writing of RRO/ZAP fields in which the servo channels receive and process read data, trigger write gates and request write control upon determining RRO/ZAP fields are to be written to respective surfaces, write data when given write access and return control when RRO/ZAP fields are written. At 406, the write control module (e.g. firmware, WCM 302, etc.) may determine whether an event has occurred. At 408, the write control module may determine what type of an event has occurred and continues to one of 410, 412 or 414 based on the determination (e.g. to 410 if a write request is received while write control is already assigned to another servo channel, to 412 if a write request is received while write control is free or to 414 if a release of write control is received). At 410, if the event is a write request and the write control module determines that write access has already been granted to another servo channel, the write control module may block the write access request and inform an error handling system. The error handling system may operate in a manner similar to that discussed above. At 412, if the event is a write request and the write control module determines that write access is available to be granted to the requesting servo channel, the write control module may pass write control the requesting to servo channel and set a register to cause other servo channel write access requests to be blocked. At 414, if a release of write control is received from a servo channel, the register may be cleared to allow for a servo channel to request write access.

All steps listed for the method 400 may be applied to multiple input systems. Many variations would be apparent in view of this disclosure. Further, though FIGS. 3 and 4 discuss examples involving the parallelized writing of RRO/ZAP fields, embodiments are not so limited and other embodiments may utilize the same techniques to perform parallelized writing of other position information. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 5:
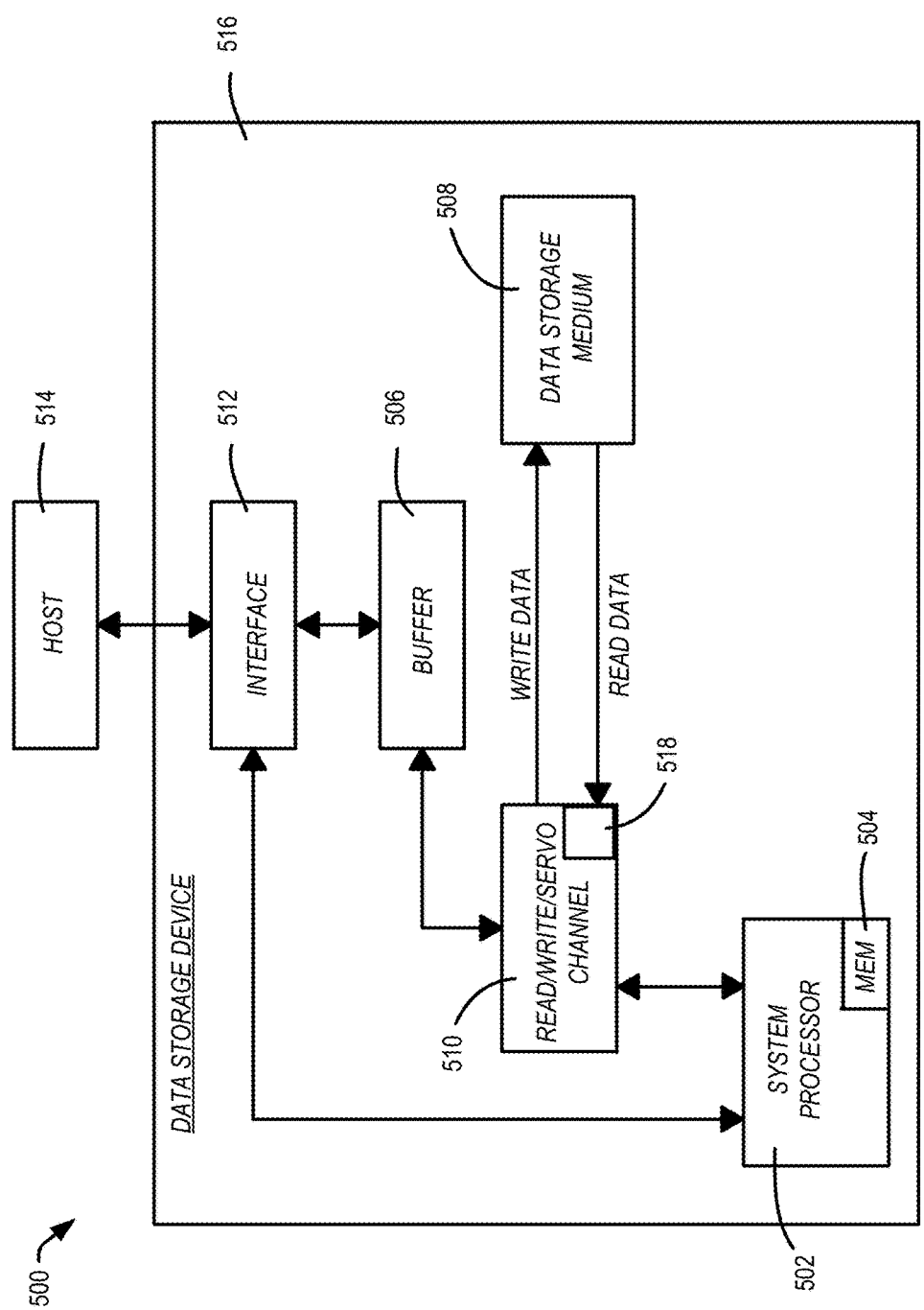
FIG. 5 is a block diagram of a system including a multi-sensor magnetic recording (MSMR) system architecture which may include functionality to write position information such as servo fields, RRO/ZAP fields or other formatting information to a plurality of storage surfaces in parallel, in accordance with certain embodiments of the present disclosure.

Referring to FIG. 5, a block diagram of a system including a multi-sensor magnetic recording (MSMR) system architecture which may include functionality to write position information such as servo fields, RRO/ZAP fields or other formatting information to a plurality of storage surfaces in parallel is shown and generally designated 500. The system 500 can be an example of a data storage device (DSD), and may be an example implementation of system 100. The DSD 516 can optionally connect to and be removable from a host device 514, which can be a device or system having stored data, such as a desktop computer, a laptop computer, a server, a digital video recorder, a photocopier, a telephone, a music player, other electronic devices or systems not listed, or any combination thereof. The data storage device 516 can communicate with the host device 514 via the hardware/firmware based host interface circuit 512 that may include a connector (not shown) that allows the DSD 516 to be physically connected and disconnected from the host 514.

The DSD 516 can include a system processor 502, which may be a programmable controller, and associated memory 504. The system processor 502 may be part of a system on chip (SOC). A buffer 506 may temporarily store data during read and write operations and can include a command queue. The read/write (R/W) channel 510 can encode data during write operations to, and reconstruct data during read operations from, the data storage medium 508. The data storage medium 508 is shown and described as a hard disc drive, but may be other types of magnetic medium, such as a flash medium, optical medium, or other medium, or any combination thereof.

The R/W channel 510 may receive data from more than one data storage medium at a time, and in some embodiments can also receive multiple data signals concurrently, such as from more than one output of a reader. Multi-sensor magnetic recording (MSMR) systems can receive two or more inputs from multiple sources (e.g. recording heads, flash memory, optical memory, and so forth) associated with the same magnetic medium. The R/W channel 510 can combine multiple inputs and provide a single output, as described in examples herein.

The block 518 can implement all of or part of the systems and functionality of systems and methods 100-400. In some embodiments, the block 518 may be a separate circuit, integrated into the R/W channel 510, included in a system on chip, firmware, software, or any combination thereof.

In the examples discussed herein, two signals are received and processed. However, the systems and methods discussed herein may be generalized to any number (N) of signals. Many variations would be apparent to one of ordinary skill in the art in view of this disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a first servo channel configured to output first position information to a first writer via a shared write path such that the first writer writes the first position information to a first magnetic recording medium surface;
   a second servo channel configured to output second position information to a second writer via the shared write path such that the second writer writes the second position information to a second magnetic recording medium surface;
   a controller configured to control the shared write path such that write access is changed between the first servo channel and second servo channel a plurality of times during a revolution of the first magnetic recording medium surface and second magnetic recording medium surface.

2. The apparatus of claim 1, further comprising
   the first writer configured to write to the first magnetic recording medium surface;
   the second writer configured to write to the second magnetic recording medium surface;
   a first reader configured to read from the first magnetic recording medium surface to generate a first read signal;
   the first servo channel configured to determine a first write position at which to write the first position information based at least in part on the first read signal;
   a second reader configured to read from the second magnetic recording medium surface to generate a second read signal; and
   the second servo channel configured to determine a second write position at which to write the second position information based at least in part on the second read signal.

3. The apparatus of claim 2, further comprising the first reader and the second reader being readers of a multi-sensor magnetic recording (MSMR) hard drive.

4. The apparatus of claim 2, further comprising the first servo channel being configured to request write access from the controller based on the determined first write position.

5. The apparatus of claim 4, further comprising the controller being configured to:
   receive the request for write access from the first servo channel;
   determine that write access is available; and
   assign write access to the first servo channel.

6. The apparatus of claim 5, further comprising the first servo channel being further configured to:
   receive the assignment of write access;
   output the first position information to the first writer via the shared write path; and
   return write access to the controller when the output of the first position information is complete.

7. The apparatus of claim 4, further comprising the controller being configured to:
   receive the request for write access from the first servo channel;
   determine that write access is not available; and
   deny write access to the first servo channel.

8. The apparatus of claim 7, further comprising:
   a first phase locked loop (PLL) configured to output a first clock signal to the first servo channel and shared write path;
   the first servo channel further configured to generate a first disk locked clock signal to the first PLL to lock the first clock signal to the data stored on the first magnetic recording medium surface;
   a second PLL configured to output a second clock signal to the second servo channel and shared write path;
   the second servo channel further configured to generate a second disk locked clock signal to the second PLL to lock the second clock signal to the data stored on the second magnetic recording medium surface; and
   the controller configured to control the shared write path to operate based on one of the first clock signal and second clock signal based on assignment of write access to a respective one of the first servo channel and the second servo channel.

9. The apparatus of claim 7, further comprising the first position information and the second position information being RRO/ZAP information.

10. A system comprising:
    a first servo channel configured to output first position information to a first writer such that the first writer writes the first position information to a first magnetic recording medium surface of a hard disk drive;
    a second servo channel configured to output second position information to a second writer such that the second writer writes the second position information to a second magnetic recording medium surface of the hard disk drive, the first servo channel including a first circuit and the second servo channel including a second circuit separate from the first circuit;
    the first servo channel configured to output the first position information to the first writer such that the first position information is written to a first location and a second location, separate from the first location, during a particular revolution; and
    the second servo channel configured to output the second position information to the second writer such that the second position information is written to a third location during the particular revolution, the third location between the first location and second location.

11. The system of claim 10 further comprising:
    the first writer configured to write to the first magnetic recording medium surface of the hard disk drive;
    the second writer configured to write to the second magnetic recording medium surface of the hard disk drive;
    the first servo channel being configured to output the first position information to the first writer via a shared write path;
    the second servo channel being configured to output the second position information to the second writer via the shared write path;
    a controller configured to control the shared write path such that write access is changed between the first servo channel and second servo channel a plurality of times during a revolution of the first magnetic recording medium surface and second magnetic recording medium surface.

12. The system of claim 11 further comprising:
a first reader configured to read from the first magnetic recording medium surface to generate a first read signal;
the first servo channel configured to determine a first write position at which to write the first position information based at least in part on the first read signal;
a second reader configured to read from the second magnetic recording medium surface to generate a second input signal; and
the second servo channel configured to determine a second write position at which to write the second position information based at least in part on the second read signal.

13. The system of claim 12 further comprising the first servo channel being configured to request write access from the controller based on the determined first write position.

14. The system of claim 13 further comprising the controller being configured to:
receive the request for write access from the first servo channel;
determine that write access is available; and
assign write access to the first servo channel.

15. The system of claim 14 further comprising: further comprising the first servo channel being further configured to:
receive the assignment of write access;
output the first position information to the first writer via a shared write path; and
return write access to the controller when the output of the first position information is complete.

16. The system of claim 14 further comprising:
a first phase locked loop (PLL) configured to output a first clock signal to the first servo channel and shared write path;
the first servo channel further configured to generate a first disk locked clock signal to the first PLL to lock the first clock signal to the data stored on the first magnetic recording medium surface;
a second PLL configured to output a second clock signal to the second servo channel and shared write path;
the second servo channel further configured to generate a second disk locked clock signal to the second PLL to lock the second clock signal to the data stored on the second magnetic recording medium surface; and
the controller configured to control the shared write path to operate based on one of the first clock signal and second clock signal based on assignment of write access to a respective one of the first servo channel and the second servo channel.

17. The system of claim 12 further comprising the first reader and the second reader being readers of a multi-sensor magnetic recording (MSMR) hard drive.

18. A method comprising:
during a revolution of a hard disk assembly of a multi-sensor magnetic recording (MSMR) hard drive:
reading, by a first reader of the MSMR hard drive, from a first magnetic recording medium surface to generate a first read signal;
determining, by a first servo channel of the MSMR hard drive, a first write position at which to write first position information based at least in part on the first read signal;
requesting, from a controller of the MSMR hard drive, by the first servo channel, write access to a shared write path based on the determined first write position;
receiving, by the first servo channel, a first assignment of write access;
outputting, by the first servo channel, the first position information to a first writer via the shared write path; and
returning, by the first servo channel, write access to the controller when the output of the first position information is complete;
reading, by a second reader of the MSMR hard drive, from a second magnetic recording medium surface to generate a second read signal;
determining, by a second servo channel of the MSMR hard drive, a second write position at which to write second position information based at least in part on the second read signal;
requesting, from the controller of the MSMR hard drive, by the second servo channel, write access to the shared write path based on the determined second write position;
receiving, by the second servo channel, a second assignment of write access;
outputting, by the second servo channel, the second position information to a second writer via the shared write path; and
returning, by the second servo channel, write access to the controller when the output of the second position information is complete.

19. The method of claim 18 further comprising
receiving, by the controller, the request for write access from the first servo channel;
determining, by the controller, that write access is available; and
assigning, by the controller, write access to the first servo channel and sending the first assignment of write access to the first servo channel.

20. The method of claim 18 further comprising:
determining, by the first servo channel of the MSMR hard drive, a third write position at which to write third position information based at least in part on the first read signal;
requesting, from a controller of the MSMR hard drive, by the first servo channel, write access to the shared write path based on the determined third write position;
receiving, by the first servo channel, a third assignment of write access;
outputting, by the first servo channel, the first position information to the first writer via the shared write path; and
returning, by the first servo channel, write access to the controller when the output of the first position information is complete.

* * * * *